US006359440B2

(12) United States Patent
Pohl et al.

(10) Patent No.: US 6,359,440 B2
(45) **Date of Patent: *Mar. 19, 2002**

(54) METHOD OF ESTABLISHING THE RESIDUAL USEFUL LIFE OF CONTACTS IN SWITCHGEAR AND ASSOCIATED ARRANGEMENT

(75) Inventors: Fritz Pohl, Hemhofen; Norbert Elsner, Bubenreuth, both of (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/117,585

(22) PCT Filed: Jan. 29, 1997

(86) PCT No.: PCT/DE97/00173

§ 371 Date: Jul. 30, 1998

§ 102(e) Date: Jul. 30, 1998

(87) PCT Pub. No.: WO97/28548

PCT Pub. Date: Aug. 7, 1997

(30) Foreign Application Priority Data

Jan. 31, 1996 (DE) ........................................ 196 03 310

(51) Int. Cl.$^{7}$ ....................... G01R 31/02; G01R 31/327

(52) U.S. Cl. ....................................................... 324/423

(58) Field of Search ................................ 324/423, 418, 324/420, 422, 421, 424, 537

(56) References Cited

U.S. PATENT DOCUMENTS 4,319,193 A * 3/1982 Boccali et al. .............. 324/418
5,115,189 A * 5/1992 Terminiello et al. ........ 324/415
5,134,375 A * 7/1992 Fuchi ......................... 324/419
5,243,291 A 9/1993 Umemura

FOREIGN PATENT DOCUMENTS

| | | |
|---|---|---|
| DE | 1 092 101 | 11/1960 |
| DE | 40 28 721 | 3/1992 |
| DE | 41 37 543 | 5/1993 |
| DE | 43 00 620 | 7/1994 |
| DE | 44 17 694 | 11/1995 |
| DE | 44 27 006 | 2/1996 |
| EP | 694 937 | 1/1996 |

OTHER PUBLICATIONS

"Integrated Self–Diagnosis and Control Systems of High–Voltage Switching Devices," Herbert Karrenbauer et al., etz, vol. 14, Issue No. 11, (No month available) 1993, pp. 692–696 Abstract is provided.

"Isolation Amplifiers having Optical Channels," Klaus Schönhoff, Elektor, Jun. 1994, p. 45. Translation is provided.

* cited by examiner

*Primary Examiner*—Safet Metjahic
*Assistant Examiner*—James C Kerveros

(57) ABSTRACT

To determine the remaining lifetime of contactor contacts, the contact spring action at the clearance gap can be determined as a substitute criterion for contact erosion, and to determine the erosion of the contact points, the change in spring action during the shutdown cycle can be measured and converted to the remaining lifetime, for which purpose, the time of the armature movement from the start of the armature movement to the start of contact opening is measured with the solenoid actuator having an armature with solenoids and associated yoke. The measured values of the time signal $t_k$ of contact opening on the load side of the switching device monitored and the time signal $t_A$ are determined by voltageless signaling of the start of armature movement. In particular for use in three-phase systems, the switching voltage is measured as a voltage change at an artificial neutral point. In the respective arrangement, a voltageless signal line is provided between the switching device and analyzer unit.

25 Claims, 5 Drawing Sheets

METHOD OF ESTABLISHING THE RESIDUAL USEFUL LIFE OF CONTACTS IN SWITCHGEAR AND ASSOCIATED ARRANGEMENT

FIELD OF THE INVENTION

The present invention relates to a method of determining the remaining lifetime of contacts in switchgear, in particular contractor contacts. The present invention also relates to the respective arrangement for carrying out the method, with an analyzer unit for displaying the remaining lifetime.

BACKGROUND INFORMATION

In German Patent Application No. 44 27 066 (not prior art), the remaining lifetime of a contactor in the shutdown cycle is derived from the difference in time between the start of the armature opening movement and the start of contact opening. Using an analysis algorithm, a microprocessor then determines from the time difference value the present value of the contact spring action, which decreases from its value when new (=100% remaining lifetime) to its minimum value (=0% remaining lifetime) due to contact erosion. The time signals required for this are detected first by interrupting an auxiliary circuit over the armature and yoke of the solenoid actuator and also by the contact voltage at the main contacts and are converted to well-defined voltage pulses, for which purpose measuring leads must be attached.

Attaching measuring leads (six leads for three-phase current) for analysis of contact voltages may be problematical inasmuch as a) the possibility of vagabond voltage forming from the infeed side to the load side of the contactor cannot be ruled out, b) the required insulation voltage endurance (8 kV) results in a higher cost for the analysis circuit, and c) integrating the measuring leads into the contactor and connecting them to a plug-in connector necessitates design and safety-related changes.

SUMMARY OF THE INVENTION

An object of the present invention is to provide a method and the respective arrangement, wherein the start of contact opening need not be determined over measuring leads on both the feed and load ends of the main circuit.

This object is achieved according to the present invention by measured value acquisition on the contact gap on the load side of the monitored switching device and by voltageless signaling of the start of armature movement. For use in three-phase systems, the start of contact opening of the contact points with the greatest erosion of one of the switching poles is preferably detected by measuring the switching voltage as the change in voltage at an artificial neutral point on the load side of the switching device monitored, from which it is then possible to determine the remaining lifetime of the main contacts of the contactor in addition to the start of armature movement.

In the respective arrangement with an analyzer unit for displaying the remaining lifetime, there is a voltageless signal line on the armature and yoke of the solenoid actuator of the switching device between the switching device and the analyzer unit. The analyzer unit is thus located between the switching device and the electric consumer on the load side.

To reduce the technical complexity, it is thus no longer necessary to monitor each main circuit individually with regard to contact erosion in three-phase systems in particular, but instead only the spring action of the most eroded contacts of one of the three switching poles is measured to determine the remaining lifetime of the main contacts of the contactor. Furthermore, it is possible to determine the remaining lifetime without a strict spatial correlation with the contactor, the start of the armature opening movement being signaled to the analyzer unit over a voltageless signal line as contact interruption between armature and yoke.

Voltageless signaling in the aforementioned context is understood to refer to electric contacting between armature and yoke, in contrast with a voltage signal, such as the contact voltage on the main contacts.

DETAILED DESCRIPTION OF THE INVENTION

Figure 1:
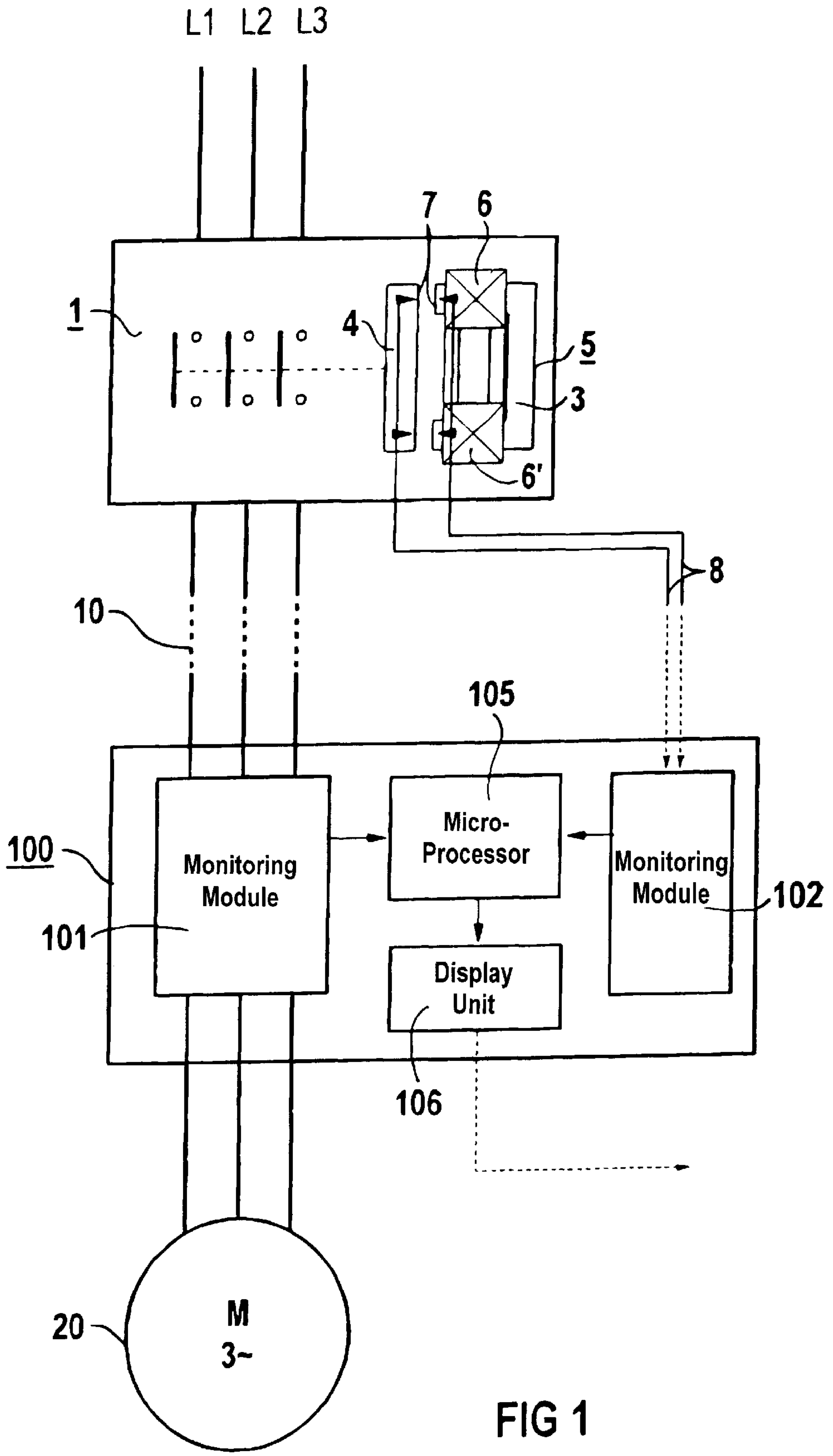
FIG. 1 shows a device for determining a remaining lifetime of contactors in a shutdown cycle according to the present invention.

FIG. 1 shows a schematic diagram of a device for determining the remaining lifetime and associating it with a contactor 1. Analyzer unit 100 is located between contactor 1 and electric consumer 20, e.g., a motor, on load side 10, and it is contacted with external conductors L1, L2, L3 over a first monitoring module 101 for detecting contact opening. A two-wire communication line 8 connects armature/yoke contact 7 of contactor 1 to a second monitoring module 102 for detecting opening of the armature. A microprocessor 105 determines the instantaneous contact spring action from the time signals supplied by monitoring modules 101 and 102 and determines from this the remaining electrical lifetime of the main contacts.

The value determined by analyzer unit 100 for the remaining lifetime is displayed on an output unit 106 and can be output over a bus system for further processing.

As shown by control measurements on a contactor with the armature/yoke contact brought out, the time signals from which the remaining lifetime is determined are subject to time fluctuations due to mechanical tolerances and decay of the magnetic force. The time difference between the time signals may therefore differ by a few 1/10 ms between two successive analyses. To avoid a corresponding fluctuation in the output quantity, the remaining lifetime is determined on the basis of a sliding average, e.g., the last ten measurements. Therefore, an accuracy of 1/10 mm is considered realistic in determining the contact spring action. Faulty analyses in determining the time difference can be prevented by analyzing only those time signals within a predetermined time window.

Figure 2:
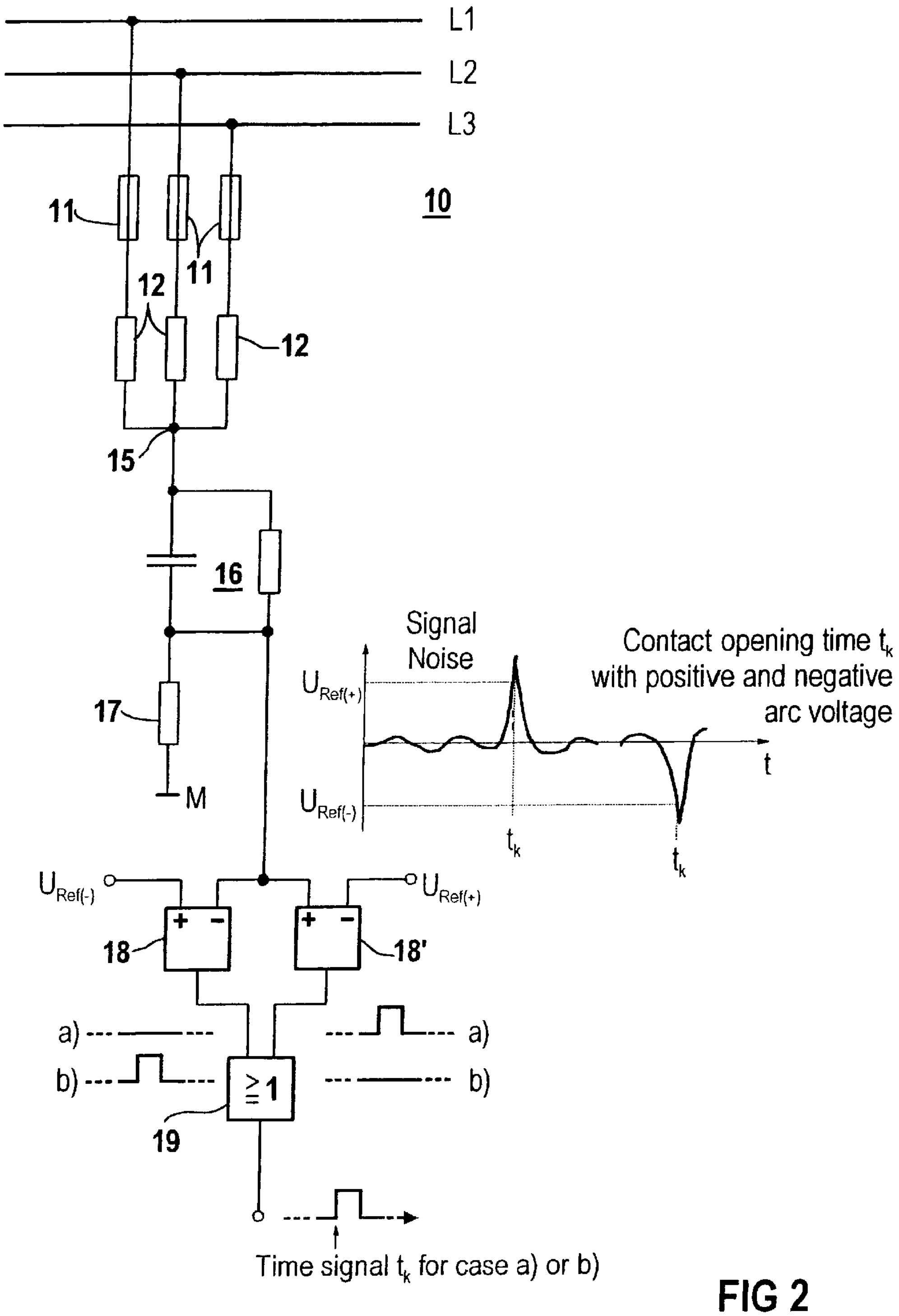
FIG. 2 shows a circuit for generating a time signal for a first main circuit of contactors to clear in the shutdown cycle in a three-phase system.

FIG. 2 shows an example of a circuit for generating a time signal $t_k$ at the start of contact opening of the most eroded main contacts. The essential characteristic of this circuit is that it measures the contact voltages (arc voltage) of a triple-pole switching device in a three-phase system at "artificial" neutral point 15. For the contact voltages, i.e., the arc voltage at interconnection point 15 of the output lines over fine-wire fuses 11 and resistors 12 (R=160 kΩ), the following equations hold:

$$U_1+U_2+U_3=O,\ I_1+I_2+I_3=O$$

$$U_1-U_{STP}=R*I_1+L*d/dt(I_1)+UB_1$$

$$U_2-U_{STP}=R*I_2+L*d/dt(I_2)+UB_2$$

$$U_3-U_{STP}=R*I_3+L*d/dt\ (I_3)+UB_3$$

Total: $U_{STP}=-(UB_1+UB_2+UB_3)/3$, where the following symbology has been selected:

$U_i$=phase voltages $I_i$=phase currents, $U_{Bi}$=arc voltages, i=1, 2, 3

$U_{STP}$=neutral point displacement voltage,

R=ohmic load,

L=inductive load.

With the main contacts of the contactor closed ($UB_1=UB_2=UB_3=0$), the neutral point displacement voltage would have to be 0 volt. In fact, however, the real phase voltages do not correspond to ideal sinusoidal voltages, so that the total of the phase voltages differs from zero and the neutral-to-ground voltage fluctuates around the voltage zero line. This signal noise can be reduced by a high-pass filter 16 (e.g., where C=3 nF, $R_{parallel}$=500 kΩ) so that a signal-to-noise ratio of >10 is achieved. Electronic frame potential M can be picked off over a measuring shunt (e.g., $R_{Me\beta}$=10 kΩ). Time signal $t_k$, i.e. the voltage signal at "artificial" neutral point 15, is processed according to its polarity by one of two comparators 18 and 18' whose outputs are coupled to the signal output of the monitoring module for contact opening via an OR gate 19.

Figure 3:
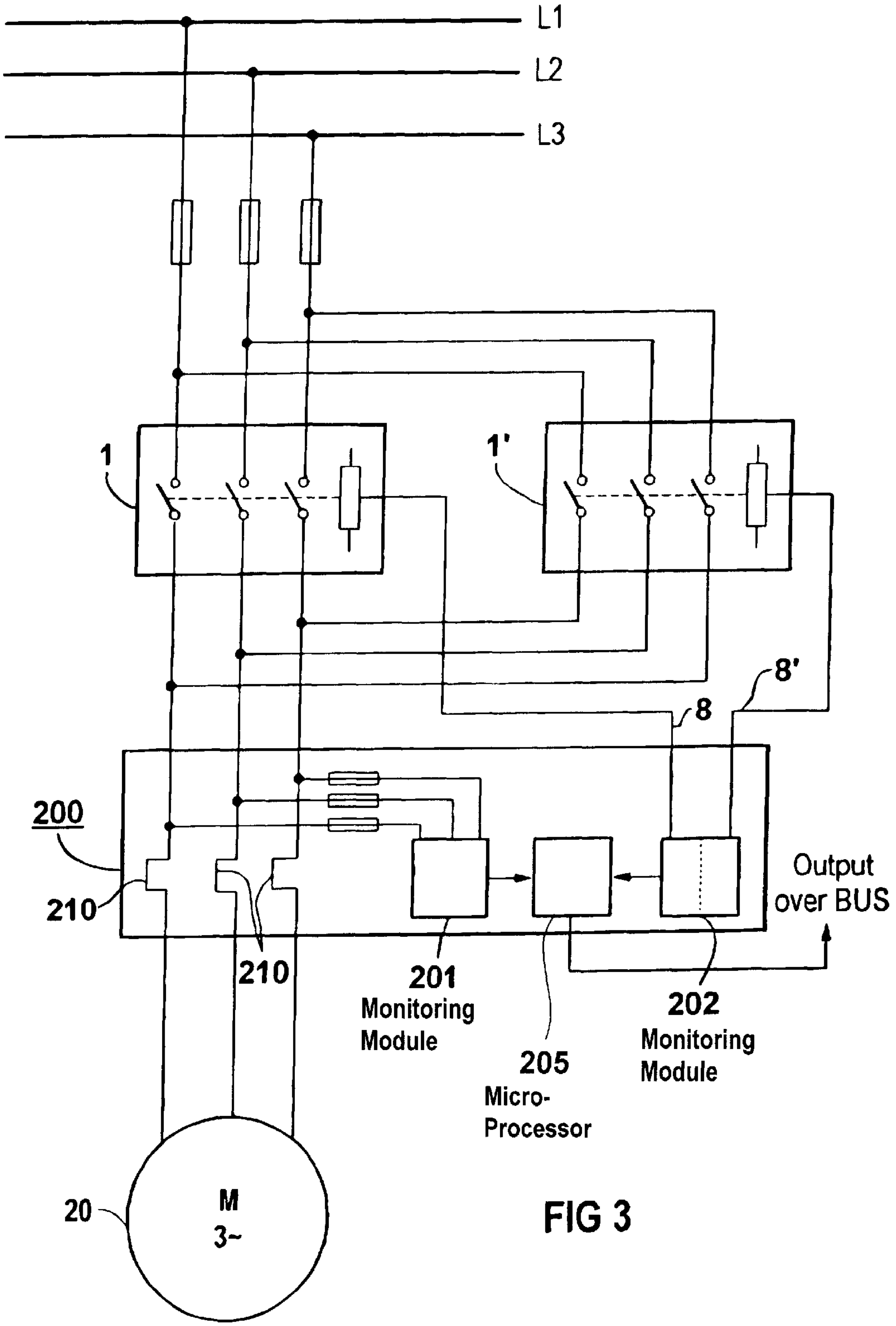
FIG. 3 shows a device for determining the remaining lifetime of a reversing contactor circuit.

FIG. 3 shows a device for determining the remaining lifetime on the example of a contactor reversing starter with two contactors 1 and 2; for application in three-phase motors, there are many different terminal conditions for controlling the speeds and direction of rotation.

The main circuits switched by contactors 1 and 2 correspond in basic design to the main circuits according to FIG. 1 or 3. There is usually an overload relay 210 on the load side of contactor 1 or 2 to protect the motor load. It is therefore expedient to integrate overload relays 210 and the device for determining remaining lifetime into a common control unit. As described in German Patent Application No. 44 27 006, this control unit could have additional functions for monitoring the circuit state, so that this would ultimately result in a "general" control unit 200 for monitoring the entire electric system.

In the example in FIG. 3, only one second measuring channel is needed on monitoring module 202 for armature opening to detect the remaining lifetime of both contactors 1 and 2. Microprocessor 205 attributes the calculated lifetime to the contactor represented by the signaling measuring channel.

Figure 5:
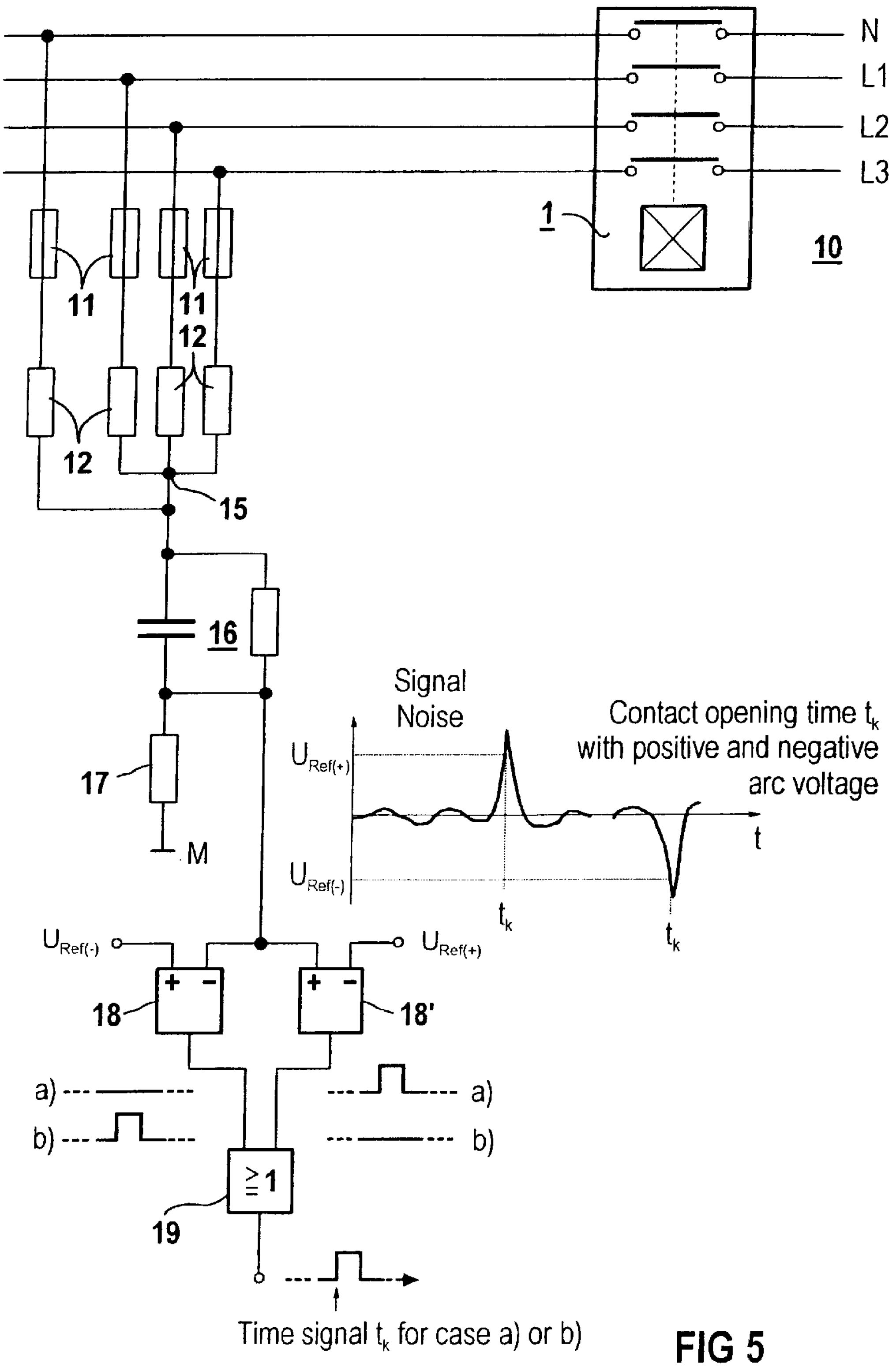
FIG. 5 shows a three-phase system including a four-pole switching device for three phases of a three phase current and a neutral conductor.

In three-phase systems, not only three-pole consumers, but also four-pole consumers, e.g., ohmic loads, are connected to the system and disconnected from it by electric switchgear. The electric switchgear have four switching poles, three of which are connected to external conductors L1, L2, L3, while the fourth switching pole is connected to the neutral conductor. An example of such a system is shown in FIG. 5, which illustrates a three-phase system including a four-pole switching device for three phases of a three phase current and a neutral conductor. The system of FIG. 5 is similar to that of FIG. 2, so a description of those elements that are common to both Figures shall not be undertaken here. As with FIG. 2, which connects a fine-wire fuse 11 and resistor 12 between each respective one of conductors L1-L3 and neutral point 15, FIG. 5 also includes a fine-wire fuse 11 and resistor 12 connected between conductor N and the line on which neutral point 15 is located. Each of these four switching poles is subject to contact erosion when the four-pole consumer is connected and disconnected, so that wear on all contact points must be monitored, and the remaining lifetime must be determined according to the most eroded contact points.

The latter is achieved by measuring the switching voltage of one of the three switching poles connected to external conductors L1, L2, L3 at artificial neutral point 15 and measuring the switching voltage of the fourth switching pole connected to neutral conductor N on neutral conductor N. Both the voltage of artificial neutral point 15 and the voltage of neutral conductor N are detected on load side 10 of monitored switching device 1, and the error voltage, the difference between the two voltage values, is analyzed as the switching voltage of the first, most eroded contact tips to clear.

Figure 4:
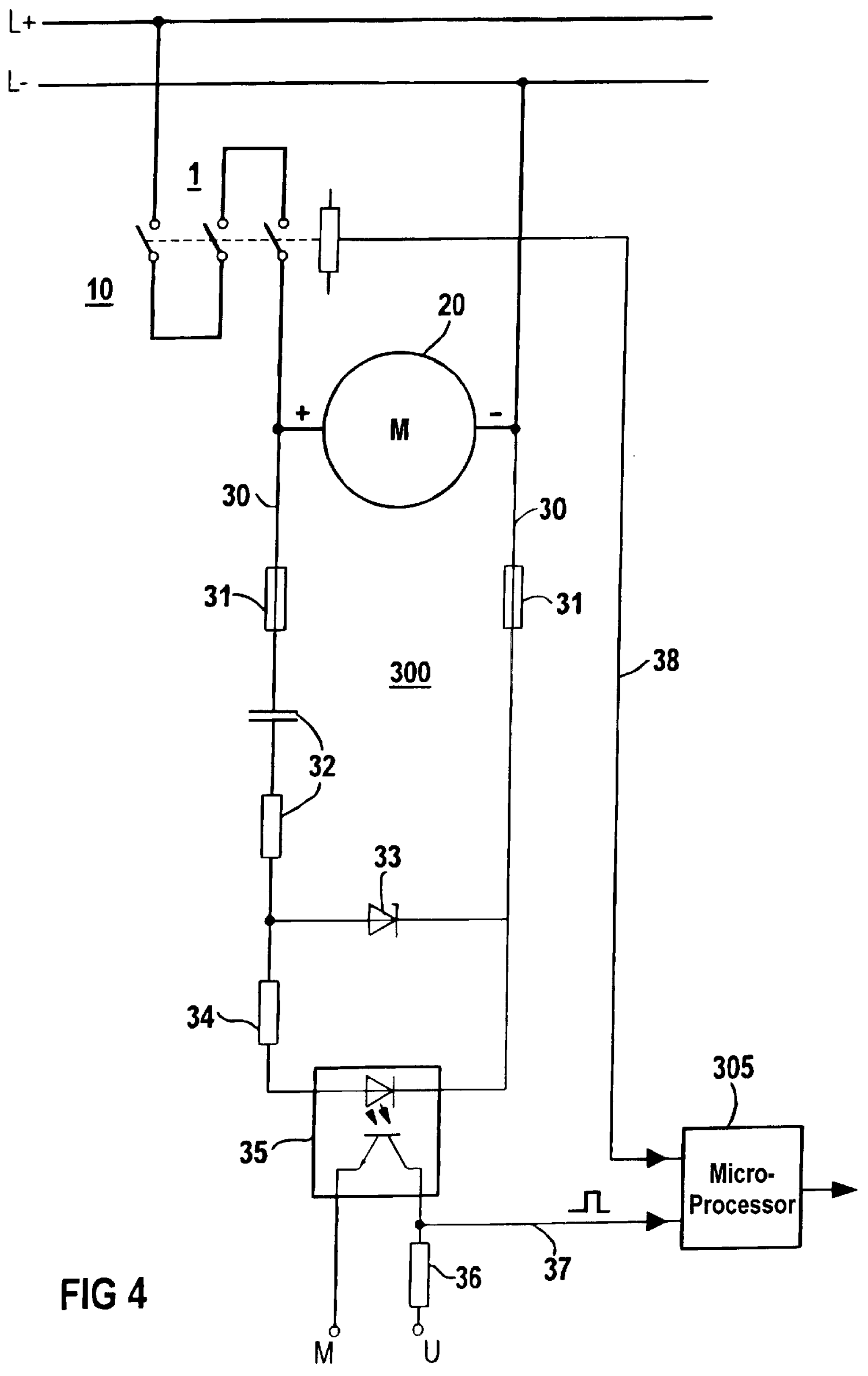
FIG. 4 shows a device for determining the remaining lifetime of contactors in the shutdown cycle in d.c. systems.

FIG. 4 shows a device for detecting the remaining lifetime of contactors in d.c. systems. Depending on the system d.c. voltage and whether or not the d.c. system is grounded, the contact gaps are usually connected in series, and the connection of the electric system is designed with a single pole or two poles. To obtain a uniform terminal condition for the test connectors for monitoring contact opening and to rule out vagabond voltage from the infeed side to the load side of contactor 1, the measuring leads are connected to load side 10.

In the exemplary embodiment in FIG. 4, a monitoring module 300 has individual circuit elements 31 through 38. Specifically, it shows a contactor 1 with load side 10, a d.c. motor 20 and output lines 30 for connecting monitoring module 300. It contains two fine-wire fuses 31, an RC combination 32 (C=0.22 MF, $R_1$=1 kΩ), a Zener diode 33, a resistor 34 ($R_2$=330 Ω) and an optical coupler 35, whose output is connected to voltage U across a resistor 36 (R=106 kΩ).

Blocking capacitor C in monitoring module 300 for contact opening serves to suppress the d.c. component; associated limiting resistors R1 and R2 with the Zener diode serve to limit the voltage, and optical coupler 35 in particular is for voltageless measurement of the contact voltage. A microprocessor 305 determines the contact spring action from time signal $t_k$ of contact opening in the delay to the time signal of armature opening, and from this it determines the remaining lifetime of the main contacts of the contactor.

In all exemplary embodiments, the values determined by the microprocessors can be displayed directly on associated output units or sent to a system for data transmission, in particular a bus system, for further analysis.

What is claimed is:

1. A method for determining a remaining lifetime value of contacts in a switchgear, comprising the steps of:

determining a contact spring action at a contact gap;

during a shutdown cycle, measuring each change in the contact spring action to determine a contact erosion, including the steps of measuring a run-time value of an armature path from a first start of an armature movement in a contactor solenoid actuator to a second start of an opening of at least one of the contacts, the measuring step being performed on a load side of the switchgear, the first start of the armature being determined by a voltageless signaling of a start of the armature movement, determining a path length as a function of the run-time value, and determining the change in contact spring action by a change in the path length;

determining an erosion of at least one of the contacts as a function of the change in the contact spring action; and determining the remaining lifetime value of the at least one of the contacts as a function of the erosion.

2. The method according to claim 1, wherein the contacts are contactor contacts.

3. The method according to claim 1, wherein the contacts are driven by the armature, a solenoid and a yoke.

4. The method according to claim 1, wherein the method is used in a three-phase system, the method further comprising the steps of:

determining a switching voltage as a function of a voltage change at an artificial neutral point on the load side of the switchgear;

detecting the second start of the opening of the at least one of the contacts as a function of the determining the switching voltage step, the at least one of the contacts having a first erosion, the first erosion being a greatest erosion as compared to respective erosions of others of the contacts; and determining the remaining lifetime value as a function of the detecting step.

5. The method according to claim 4, wherein the at least one of the contacts are mains contacts of a contactor.

6. The method of claim 1, wherein the second start of an opening of at least one of the contacts is determined by measuring a voltage rise of at least one of the contacts.

7. The method of claim 6, wherein the measuring of the voltage rise is performed on a load side of the switchgear.

8. The method of claim 1, wherein the path length is a length of the armature path.

9. An arrangement for determining a remaining lifetime value of contacts in a switchgear, comprising:

an analyzer unit determining and displaying the remaining lifetime value; and a voltageless signal line arranged between the switchgear and the analyzer unit, the voltageless signal line provided to an armature and a yoke, a solenoid of the switchgear including the yoke.

10. The arrangement according to claim 9, wherein the contacts are contactor contacts.

11. The arrangement according to claim 9, wherein the analyzer unit is positioned on a load side between the switchgear and an electric consumer.

12. The arrangement according to claim 9, wherein the analyzer unit includes a first monitoring module determining a start of a movement of an armature to generate a first time signal, and a second monitoring module determining a start of an opening of at least one of the contacts to generate a second time signal.

13. The arrangement according to claim 12, wherein the analyzer unit includes a microprocessor determining a contact spring action as a function of the first time signal and the second time signal.

14. The arrangement according to claim 9, wherein the arrangement is a part of a three-phase system including a three-pole switching device, the analyzer unit further including:

a circuit arrangement generating a time signal at a start of an opening of at least one of the contacts, the at least one of the contacts having a greatest erosion as compared to respective erosions of others of the contacts, the circuit arrangement further measuring a contact voltage at an artificial neutral point.

15. The arrangement according to claim 9, wherein the arrangement is included in a three-phase system, the three-phase system including a four-pole switching device, the four-pole switching device including three external conductors and a neutral conductor, the first arrangement further including:

a circuit arrangement generating a time signal at a start of an opening of at least one of the contacts, the at least one of the contacts having a greatest erosion as compared to respective erosions of others of the contacts, the circuit arrangement further detecting a contact voltage of the four-pole switching device by measuring a voltage between an artificial neutral point and a voltage of the neutral conductor, the neutral conductor being on a load side of the switching device as a reference potential of a resistor at a frame potential.

16. The arrangement according to claim 9, wherein the arrangement is included in a three-phase motor arrangement, the three-phase motor arrangement including an overload relay to protect a load of a motor, the overload relay and the analyzer unit being integrated into a common control device for detecting the remaining lifetime value.

17. The arrangement according to claim 9, further comprising:

contact gaps connected in series for one of a single-pole and two-pole connection to a d.c. system; and measuring leads connected to a load of the d.c. system.

18. The arrangement according to claim 9, the analyzer unit including:

a monitoring module including a blocking capacitor for suppressing a d.c. component, limiting resistors, a zener diode for voltage limiting, and an optical coupler for voltageless measurement of a contact voltage.

19. The arrangement according to claim 9, further comprising:

a system for data transmission coupled to the analyzer unit.

20. The arrangement according to claim 19, wherein the system for data transmission is a bus system.

21. The arrangement of claim 9, wherein the analyzer further:

determines a contact spring action at a contact gap;

during a shutdown cycle, measures each change in the contact spring action to determine a contact erosion, including measuring a run time value of an armature path from a first start of an armature movement in a contactor solenoid actuator to a second start of an opening of at least one of the contacts, the measuring being performed on a load side of the switchgear, the first start of the armature being determined by a voltageless signaling of a start of the armature movement, determining a path length as a function of the run-time value, and determining the change in contact spring action by a change in the path length;

determines an erosion of at least one of the contacts as a function of the change in the contact spring action; and determines the remaining lifetime value of the at least one of the contacts as a function of the erosion.

22. A method for determining a remaining lifetime value of contacts in a switchgear, comprising the steps of:

measuring a change in contact spring action to determine a contact erosion, including the steps of measuring a time difference from a first start of an armature movement in a contactor solenoid actuator to a second start of an opening of at least one of the contacts, the measuring step being performed on a load side of the switchgear, the first start of the armature being determined by a voltageless signaling of a start of the armature movement, determining an erosion of at least one of the contacts as a function of the change in the contact spring action; and determining the remaining lifetime value of the at least one of the contacts as a function of the erosion.

23. The method of claim 22, wherein the second start of an opening of at least one of the contacts is determined by measuring a voltage rise of at least one of the contacts.

24. The method of claim 23, wherein the measuring of the voltage rise is performed on a load side of the switchgear.

25. The method according to claim 22, wherein the method is used in a three-phase system, the method further comprising the steps of:

determining a switching voltage as a function of a voltage change at an artificial neutral point on the load side of the switchgear;

detecting the second start of the opening of the at least one of the contacts as a function of the determining the switching voltage step, the at least one of the contacts having a first erosion, the first erosion being a greatest erosion as compared to respective erosions of others of the contacts; and determining the remaining lifetime value as a function of the detecting step.

* * * * *